United States Patent

Douziech et al.

[11] Patent Number: 4,561,014
[45] Date of Patent: Dec. 24, 1985

[54] METHOD AND CIRCUIT FOR FREQUENCY AND PHASE LOCKING A LOCAL OSCILLATOR FOR TELEVISION

[75] Inventors: Patrick Douziech, Rives Sur Fures; Michel Imbert, Seyssin, both of France

[73] Assignee: Thomson CSF, Paris, France

[21] Appl. No.: 563,866

[22] Filed: Dec. 21, 1983

[30] Foreign Application Priority Data

Dec. 23, 1982 [FR] France .................. 82 21624

[51] Int. Cl.⁴ .................. H04N 9/50; H04N 9/46
[52] U.S. Cl. .................. 358/25; 358/19
[58] Field of Search .................. 358/25, 19, 158, 159; 331/20, 18

[56] References Cited

U.S. PATENT DOCUMENTS 3,528,026 9/1970 Groendycke .................. 331/20
4,151,485 4/1979 LaFratta .................. 375/108
4,255,759 3/1981 Ohmori et al. .................. 358/19

FOREIGN PATENT DOCUMENTS 1153795 9/1983 Canada .................. 358/158

Primary Examiner—John C. Martin
Assistant Examiner—Michael P. Dunnam
Attorney, Agent, or Firm—Cushman, Darby & Cushman

[57] ABSTRACT

A conventional phase locking loop for locking a local oscillator in phase and frequency to a color burst signal in a television system requires a highly stable (i.e. crystal controlled) oscillator whose free running frequency must be individually adjusted to be as close as possible to the desired frequency. The present invention enables such adjustment to take place automatically in operation rather than as a separate manufacturing step. The output from the oscillator is compared in phase with the color burst signal to which it is to be locked. The output from the phase comparator is applied to one input of a differential amplifier whose output constitutes an error signal for application to a frequency controlling input of the oscillator. The error signal is also applied to a threshold control circuit which causes an up/down counter to count up or down when the error signal lies outside a predetermined range. The counter total is converted to analog form and is applied to the control input in addition to the error signal.

3 Claims, 3 Drawing Figures

METHOD AND CIRCUIT FOR FREQUENCY AND PHASE LOCKING A LOCAL OSCILLATOR FOR TELEVISION

The present invention relates to color television circuits, and more particularly to chrominance decoder circuits. It is specifically applicable to receivers for television broadcasts made using the PAL or the NTSC standards.

BACKGROUND OF THE INVENTION

In some television transmitter and receiver systems, chrominance information is transmitted by amplitude and phase modulating a subcarrier of determined frequency. In order to extract chrominance information transmitted in this manner, it is necessary for a receiver to produce a signal which is at the same frequency as the transmitted subcarrier, and which is also in a determined phase relationship therewith.

This result is conventionally achieved by using a local oscillator running at a frequency which is as close as possible to the transmitted subcarrier frequency, ie. at 4.43 MHz in the PAL system or at 3.58 MHz in the NTSC system, and by frequency and phase locking the local oscillator on the transmitted subcarrier, and in particular on a portion thereof known as the "color burst". In such a color TV system, the line signal comprises a low level blanking portion followed by a few cycles (about ten) of "color burst" signal, ie. an alternating signal at the chrominance subcarrier frequency, followed by the image information per se for a television scan line in the form of mixed luminance and chrominance information.

FIG. 1 is a highly schematic diagram of a conventional local oscillator circuit associated with a color burst phase locking loop. The circuit comprises a voltage controlled oscillator (VCO) 1 having a control input 2 which serves to modify the frequency and the phase of the signal at its output 3. A crystal 4 ensures a high degree of stability, and an adjustable capacitor 5 enables the frequency of the oscillator 1 to be set at manufacture. During each color burst, the signal at the output 3 is compared in a phase comparator 7 with the burst signal 6. The output from the comparator 7 is connected to a first input of a differential amplifier 9 whose other input receives a reference signal Ref. The output from the amplifier 9 is applied to the control input 2 of the VCO 1 via a switch 8 which is switched to conduct during each burst. Further, it is necessary to introduce a time constant into the loop, eg. of about fifteen lines' duration or about 1 millisecond, in order to store the control setting over one line. This time constant is symbolized in FIG. 1 by a storage capacitor 11. In practice, most of the components shown in FIG. 1 are included in an integrated circuit, although the storage capacitor 11, the adjustable capacitor 5 and the crystal 4 are not included in the integrated circuit.

The conventional type of circuit shown in FIG. 1 has several drawbacks. The principal drawback is that it requires a highly stable oscillator 1, which in practice means a crystal controlled oscillator including means for setting the free running frequency of the oscillator (ie. the adjustable capacitor 5 in the present example). This is due to the fact that the analog phase locking loop must necessarily have low gain for reasons of stability. The requirement for a free running frequency which is as close as possible to the desired frequency entails adjustment during manufacture, and this is a non-negligeable cost factor.

For example, in a conventional commercial TV circuit, the phase comparator and its associated amplifier deliver a 10 mV control signal for an error of 1°, and the frequency of the oscillator varies by 2 Hz per mV, ie. the loop gain is 20 Hz/°. Since a tolerable phase error lies in the range of ±0.5°, this system cannot recover from frequency errors of more than 10 Hz, which explains why it is necessary to use a crystal controlled oscillator with an adjustable capacitor.

If it is desired to recover from frequency errors due to a crystal oscillator without frequency adjustment, which error may be about 300 Hz, and still retain a phase error of less than ±0.5°, the loop gain of 600 Hz/° is required. It is shown below that such a loop cannot be stable. Suppose there is a phase difference $y$ between the two inputs 3 and 6 of the comparator 7 at instant $t$. At the beginning of the comparison between the oscillator output signal 3 and the burst 6, the difference $y$ will modify the frequency $f$ of the oscillator by an amount:

$$df = 600y.$$

While the bust lasts, ie. a period $T = 2.2$ μs, the oscillator phase is thus shifted by an amount $dy$, where:

$$dy = df \times 360 \times T$$

giving $dy = 600y \times 360 \times 2.2 \times 10^{-6} = 0.5y$ approx.

At the end of the burst with which the phase is being compared, the phase difference will be approximately $y - 0.5y = 0.5y$. The output voltage from the phase comparator is stored at the end of the comparison and the variation in frequency $df$ up to the beginning of the next burst is:

$$df = 0.5y \times 600 = 300y.$$

which means that 62 μs later (one scan line later) the phase will have shifted by an amount $dy$ which is equal to:

$$dy = df \times 360 \times 62 \times 10^{-6} = 300y \times 360 \times 62 \times 10^{-6} = 6.7y$$

This phase shift is of opposite sign to the original phase difference, so the original phase difference of 0.5y has been converted into a phase difference of 6.2y, which in turn will be converted into a phase difference of 38y, etc. The system thus diverges because of its excessive loop gain.

An object of the present invention is to provide a local oscillator which is frequency and phase locked, but which avoids the above-mentioned drawbacks of conventional systems. The invention aims to enable a crystal controlled oscillator to be used without requiring the free running frequency of the oscillator to be adjustable.

SUMMARY OF THE INVENTION

The present invention provides a method of frequency and phase locking an oscillator on a color burst signal in a television system, the oscillator including a frequency and phase controlling input, and the method consisting: in comparing the phase of an output signal from the oscillator with the phase of the color burst signal while said color burst signal is present; producing an error signal which is applied to the control input;

checking whether the error signal lies inside or outside a predetermined range V1–V2; and, when the error signal lies outside the predetermined range, in acting on an up/down counter having a count output which is converted to analog form and which is also applied to the control input in such a manner as to tend to bring said error signal into the predetermined range. Preferably, the effect of changing the count at the count output of the counter by a single step, when said error signal is just outside the predetermined range, is to cause the error signal to change from being just outside the range to being substantially in the middle thereof.

The present invention also provides a circuit for frequency and phase locking an oscillator on a color burst signal in a television system, the oscillator including a frequency and phase controlling input, and the circuit comprising: said oscillator; a phase comparator connected to compare the phase of an output signal from the oscillator with the phase of the color burst signal; a differential amplifier connected to compare the output from the phase comparator with a reference signal; a conventional phase locking loop connecting the output from the differential amplifier to the control input of the oscillator; a threshold control circuit; an up/down counter which is caused to count up or to count down depending on whether the output signal from said differential amplifier lies to one side or to the other side of a predetermined range of values set by the threshold control circuit; and a digital-to-analog converter connected to receive the digital count reached by said counter and to apply a corresponding analog signal to the control input of the oscillator.

BRIEF DESCRIPTION OF THE DRAWING

An embodiment of the invention is described by way of example with reference to the accompanying drawing, in which.

MORE DETAILED DESCRIPTION

Figure 1:
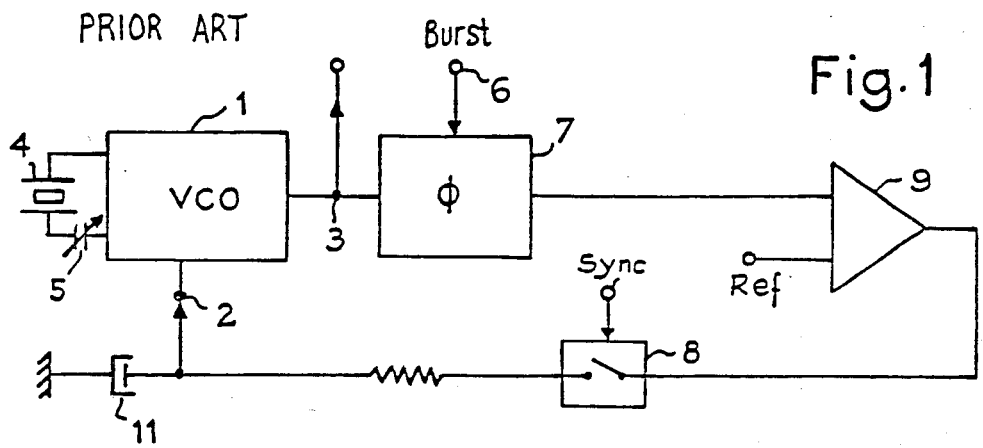
FIG. 1 is a schematic circuit diagram of a prior art local oscillator having an analog phase locking loop.
Figure 2:
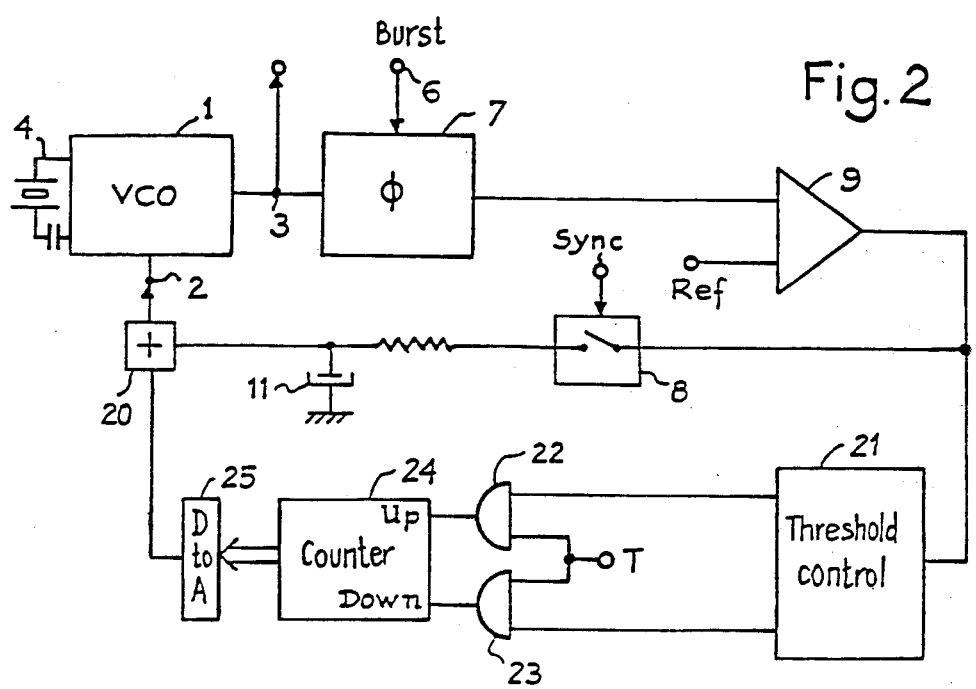
FIG. 2 is a similar circuit diagram of a local oscillator associated with a phase locking loop in accordance with the invention.

As far as possible, FIG. 2 uses the same references as have already been used in the description of FIG. 1.

The circuit shown in FIG. 2 in accordance with the present invention includes a conventional phase locking loop as shown in FIG. 1, except that the local oscillator 1 is associated with a crystal 4, but lacks an adjustable capacitor 5. In other words, the free running frequency of the local oscillator is not adjusted during manufacture. It thus follows, for the reasons of stability mentioned above, that the conventional loop has insufficient gain to ensure a suitably small phase difference relative to the phase of the color burst. To mitigate this drawback, and to enable the non-presettable local oscillator 1 to be used at the desired frequency or at a value very close thereto, the present invention uses an adder 20 to add an offset value from an analog-digital-analog loop into the above-described conventional loop.

The output from the differential amplifier 9 is applied to the input of a threshold control circuit 21. As is explained below, the threshold control circuit applies an output signal to one or other of two AND gates 22 and 23 as a function of the level of the signal applied to its input. The AND gate 22 is connected to the UP input of an up/down counter 24, while the AND gate 23 is connected to the DOWN input thereof. The digital output from the counter is applied via a digital-to-analog converter 25 and the adder 20 to the control input 2 of the voltage controlled oscillator 1.

Figure 3:
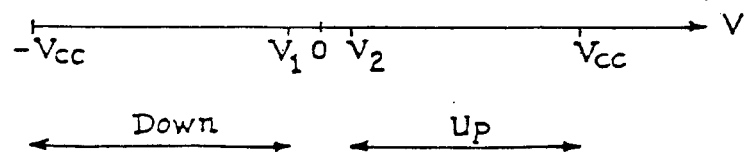
FIG. 3 is a diagram of voltage ranges over which a threshold control device in the FIG. 2 circuit operates.

As shown in FIG. 3, the threshold control circuit 21 provides different output signals depending on whether its input signal from the amplifier 9 lies in one of three different ranges. These ranges lie between a maximum value (Vcc) and a minimum value (−Vcc), and comprise a predetermined middle range about 0 lying between values V1 and V2, an upper range lying between V2 and Vcc and lower range lying between V1 and −Vcc.

The conventional loop includes a filter constituted by the capacitor 11 and resistance in series in the loop to give a time constant equal to about fifteen TV scan lines. The analog-digital-analog circuit is designed to have a much longer equivalent time constant, equal to about one frame for example. In othe words, the second inputs to the AND gates 22 and 23 are connected to receive a clock pulse signal T comprising one pulse per frame.

To explain the operation of a circuit in accordance with the invention, we begin by supposing that the conventional loop is operating on its own. This means that a large error voltage will tend to appear at the output of the amplifier 9. As a result the error voltage will move outside the predetermined middle range V1–V2 of the threshold circuit 21. Depending on the sign of the large error signal, one or other of the AND gates 22 and 23 will thus be opened to pass clock pulses T at a rate of one pulse per frame to the up/down counter 24. The counter 24 will count up or down accordingly and a corresponding voltage will be added by the adder 20 to the output signal from the amplifier 9. By suitable choice of signs, this will result in the error voltage at the output of the amplifier 9 being progressively reduced until it lies in the predetermined middle range V1–V2. As a result, the conventional loop will only be required to correct relatively small errors, while any large offset error is compensated by the digital loop. The accuracy of the system can thus be considerably increased. Suppose that the VCO responds linearly to its control input 2, and that the counter has n stages, where n is an integer. This reduces the efficiency required of the conventional loop by a factor of $2^n$. In other words, a conventional loop of given gain has its phase locking accuracy increased by a factor of $2^n$.

The counter increment step is preferably chosen in such a manner that, as soon as the error voltage reaches one of the values V1 or V2, a single step of the counter brings the error voltage back into the predetermined middle range V1–V2.

An additional advantage of an analog-digital-analog loop in accordance with the invention is that it is made of components which are easily included in an integrated circuit. In particular, it enables a correction voltage to be permanently maintained at its output without requiring a large value capacitor.

An input corresponding to the killer circuit output may be added to the threshold control circuit 21. A killer circuit is present in all TV receivers and serves to provide a low level signal whenever the oscillator 1 is not adequately locked to the color burst. By way of example, this extra input could act on the UP input to the counter 24. If the color burst is at a frequency lying outside the oscillator's capture range, the comparator 7 provides an output signal of zero average value (beats) which after filtering by the capacitor 11 has the effect of keeping the control input at zero. Further, since the voltage on the capacitor 11 is zero, the UP and DOWN inputs to the counter are inactive and the system does not change, ie. there is no phase locking.

However, by applying the killer signal (low when the system is not locked and high when it is) to activate the counter's UP input, the system will change state by counting, causing the voltage at the control input 2 to vary, thereby moving the capture range of the oscillator until it includes the burst frequency. The overall system in accordance with the invention can thus be given an increased capture range.

We claim:

1. A method of frequency and phase locking an oscillator on a color burst signal in a television system, the oscillator including a frequency and phase controlling input, and the method consisting in:
    comparing the phase of an output signal from the oscillator with the phase of the color burst signal while said color burst signal is present;
    producing an error signal which is applied to said control input;
    checking whether the error signal lies inside or outside a predetermined range (V1–V2); and
    when the error signal lies outside said predetermined range, acting on an up/down counter having a count output which is converted to analog form and which is also applied to said control input in such a manner as to tend to bring said error signal into said predetermined range.

2. A method according to claim 1, wherein the effect of changing the count at the count output of the counter by a single step, when said error signal is just outside said predetermined range, is to cause the error signal to change from being just outside the range to being substantially in the middle thereof.

3. A circuit for frequency and phase locking an oscillator on a color burst signal in a television system, the oscillator including a frequency and phase controlling input, and the circuit comprising:
    said oscillator,
    a phase comparator connected to compare the phase of an output signal from the oscillator with the phase of the color burst signal,
    a differential amplifier connected to compare the output from the phase comparator with a reference signal,
    a conventional phase locking loop connecting the output from the differential amplifier to the control input of the oscillator,
    a threshold control circuit,
    an up/down counter which is caused to count up or to count down depending on whether the output signal from said differential amplifier lies to one side or to the other side of a predetermined range of values set by said threshold control circuit,
    and a digital-to-analog converter connected to received the digital count reached by said counter and to apply a corresponding analog signal to the control input of the oscillator.

* * * * *